United States Patent [19]

Deimling

[11] Patent Number: 5,235,280
[45] Date of Patent: Aug. 10, 1993

[54] METHOD FOR DETERMINING OPTIMIZED RADIO-FREQUENCY PULSE SHAPES FOR SELECTIVE EXCITATION IN MAGNETIC RESONANCE SPECTROSCOPY AND IMAGING

[75] Inventor: Michael Deimling, Moehrendorf-Kleinseebach, Fed. Rep. of Germany

[73] Assignee: Siemens Aktiengesellschaft, Munich, Fed. Rep. of Germany

[21] Appl. No.: 925,036

[22] Filed: Aug. 5, 1992

[30] Foreign Application Priority Data

Aug. 7, 1991 [DE] Fed. Rep. of Germany ....... 4126169

[51] Int. Cl.$^5$ .............................................. G01V 3/00
[52] U.S. Cl. ..................................... 324/314; 324/300
[58] Field of Search ............... 324/314, 300, 307, 309, 324/312, 313

[56] References Cited

U.S. PATENT DOCUMENTS

| | | | |
|---|---|---|---|
| 4,656,424 | 4/1987 | Tsur et al. | 324/314 |
| 4,710,718 | 12/1987 | Shaka | 324/314 |
| 5,072,183 | 12/1991 | McKinnon et al. | 324/314 |
| 5,153,515 | 10/1992 | Leigh et al. | 324/307 |

FOREIGN PATENT DOCUMENTS

WO91/09322 6/1991 PCT Int'l Appl. .

OTHER PUBLICATIONS

"NMR Imaging Techniques and Applications: A Review," Bottomley, Review of Scientific Instrumentation, vol. 53 No. 9, Sep. 1982, pp. 1319–1334.

"Parameter Relations for the Shinnar–Le Roux Selective Excitation Pulse Design Algorithm," Pauly et al., IEEE Transactions on Medical Imaging, vol. 10, No. 1, Mar. 1991 (pp. 53–65).

"On the Use of Windows for Harmonic Analysis with the Discrete Fourier Transform," Harris, Proceedings of the IEEE, vol. 60, No. 1, Jan. 1978, pp. 51–83.

"Computer Simulation of Selective Excitation in NMR Imaging," Locher, Phil. Trans. R. Soc. Lond. B 289 (1980), pp. 537–542.

Primary Examiner—Louis Arana
Attorney, Agent, or Firm—Hill, Steadman & Simpson

[57] ABSTRACT

In magnetic resonance spectroscopy and imaging, it is usually necessary to obtain spectra only from desired, localized regions of an examination subject. This is accomplished by subjecting the examination subject to a selective radio-frequency (RF) pulse. A method for optimizing the pulse shape of such a radio-frequency pulse includes the steps of exciting a spin system with a frequency-selective radio-frequency pulse, reading out the resulting echo signal, cutting off high-frequency signal components of the echo signal using a filter, and employing the filtered echo signal as the optimized radio-frequency pulse shape.

7 Claims, 3 Drawing Sheets

METHOD FOR DETERMINING OPTIMIZED RADIO-FREQUENCY PULSE SHAPES FOR SELECTIVE EXCITATION IN MAGNETIC RESONANCE SPECTROSCOPY AND IMAGING

BACKGROUND OF THE INVENTION

1. Field of the Invention

The present invention is directed to a method for determining optimized radio-frequency pulse shapes for selective excitation of an examination subject in magnetic resonance spectroscopy and imaging.

2. Description of the Prior Art

In both in magnetic resonance spectroscopy and imaging, each nuclear magnetic resonance data-acquiring event is preceded by excitation of the examination subject with a radio-frequency (RF) pulse, having a frequency coinciding with the Larmor frequency. When the examination subject is subjected to a magnetic field gradient $G_z$ in the presence of such a radio-frequency pulse, in addition to being subjected to the uniform basic field $B_0$, the resonant frequency $\omega_R$ varies according to the formula $$\omega_R = \gamma(B_0 + G_z z)$$

along the examination subject, wherein $\gamma$ is the gyromagnetic constant and z is the locus coordinate along the z-axis.

Only nuclei in a layer having the position $$z = (\omega_R - \gamma B_0)/\gamma G_z$$

are forced out of equilibrium. Only these nuclei contribute nuclear magnetic resonance signal, while all other nuclei remain uninfluenced. Such radio-frequency pulses are referred to as "selective". Such pulses are employed in magnetic resonance spectroscopy in order to obtain spectra from localized regions of the examination subject. For imaging purposes, it is similarly only one layer of the examination subject which is excited with a selective radio-frequency pulse in virtually all instances, and a two-dimensional or three-dimensional resolution within this layer is implemented in the following read-out sequence using phase and frequency coding.

A typical spin-echo sequence is shown in FIGS. 1 through 4 as a example of the use of selective radio-frequency pulses. FIG. 1 shows two radio-frequency pulses RF1 and RF2 and the resulting signal S. FIGS. 2, 3 and 4 respective show the curves for the slice selection gradient $G_S$, the phase-coding gradient $G_P$, and the read-out gradient $G_R$.

In the spin echo sequence, a selective 90° radio-frequency pulse RF1 is first generated in the presence of a slice selection gradient $G_S$. Subsequently, the direction of the slice selection gradient $G_S$ is inverted, and a phase-coding gradient $G_P$ is generated. The FID signal which is excited as a result, however, is not directly read out. Instead, a spin echo signal S, which is read out under a read-out gradient $G_R$ is obtained by generating a second selective radio-frequency pulse RF2 having a flip angle of 180°.

The illustrated sequence is multiply repeated with different values of the phase-coding gradient $G_P$. The signal S is measured for each value of the phase-coding gradient $G_P$, and these corresponding signal values are entered into a row of a measurement matrix. Using two-dimensional Fourier transformation, an image of the spin density in the examined layer can be produced.

In the illustrated sequence, two slice-selective radio-frequency pulses RF1 and RF2 are generated, with the pulse RF1 serving the purpose of excitation and the pulse RF2 producing a spin echo.

Methods for nuclear magnetic resonance imaging are explained in greater detail in the article "NMR Imaging Techniques and Applications: A Review", Bottomley, Review of Scientific Instrumentation, Vol. 53, No. 9, September 1982. The illustrated spin echo sequence merely represents an example of a large number of instances in nuclear magnetic resonance technology wherein selective radio-frequency pulses are employed.

The goal in the selective excitation of a slice is to generate a slice profile, i.e., the size of the flip angle which is actually achieved, in a rectangular coordinate system wherein the other axis is the locus axis. Fashioning of a selective radio frequency pulse which meets this demand is difficult because a nuclear spin system does not react linearly to a radio frequency excitation. The system can be considered linear only for small flip angles (<30°), because the Block equations, which describe the reaction of the spin system to radio-frequency pulses, are approximately linear only in that range. The excitation spectrum would have to be rectangular given for a perfectly linear system. This can be achieved by modulating the radio-frequency signal with a sinc function sin x/x. For larger flip angles such as, for example, 90° or even 180°, however, the sinc function no longer leads to satisfactory slice profiles. Inadequate slice profiles lead to poor T1 and T2 tissue contrasts in gradient echo and spin echo images because of the non-uniform flip angle distribution across the selected slice. It is also a disadvantage that the signal intensity varies across the slice. On the basis of numerical solutions, those in this field have attempted to fashion selective radio-frequency pulses which improve the slice profile. Such attempted solutions are described, for example, in "Parameter Relations for Shinnar-Le Roux Selective Excitation Pulse Design Algorithm" Pouly et al., IEEE Transactions on Medical Imaging, Vol. 10, No. 1, March 1991. Such numerical methods, however, are complex and do not always lead to satisfactory solutions.

SUMMARY OF THE INVENTION

It is an object of the present invention to provide a method for generating a selective radio-frequency pulse which produces a good slice profile in a simple manner.

The above object is achieved in a method for producing an optimized radio-frequency pulse shape including the steps of exciting a spin system with a frequency-selected radio-frequency pulse and thereby producing an echo signal, reading out the echo signal, cutting off high-frequency signal parts of the echo signal using a filter, and using the filtered echo signal as the optimized radio-frequency pulse shape.

This method can be undertaken very quickly and results in radio-frequency pulses having a real amplitude and a good slice profile. Further, a slight phase variation across the selected slice is achieved. Alternatively, the echo signal as well as the optimized excitation signal can be calculated on the basis of a simulation calculation, or the echo signal can be acquired as a gradient echo within the framework of a test sequence.

DESCRIPTION OF THE PREFERRED EMBODIMENTS

Figure 6:
FIG. 6 shows a radio frequency excitation pulse with sinc functions for use in the method of the invention.
Figure 7:
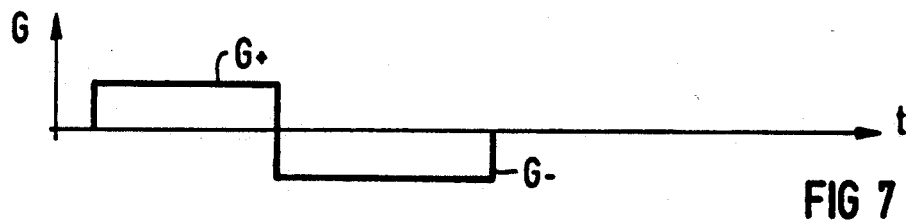
FIG. 7 shows a gradient for use in the method of the invention.
Figure 8:
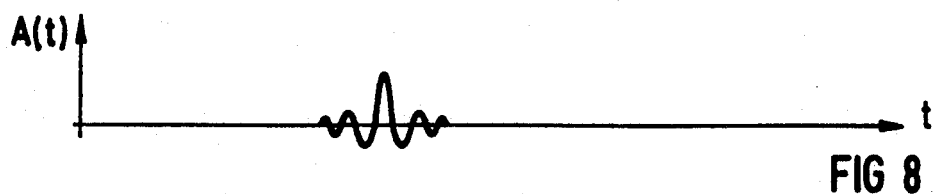
FIG. 8 shows the echo signal resulting from the excitation of an examination subject with the radio-frequency pulse of FIG. 6 in the method of the invention.

The manner of arriving at an optimized, selective radio-frequency pulse in an experimental manner in accordance with the principles of the present invention shall be described below with reference to FIGS. 6 through 8. First, an examination subject is charged with a radio-frequency pulse having a sinc form as shown in FIG. 6. This pulse becomes slice-selective by the simultaneous activation of a first pulse G+ of a gradient G as shown in FIG. 7. Subsequently, the polarity of the gradient G is inverted to generate a negative gradient pulse G, so that a gradient echo signal A(t) as shown in FIG. 8 arises.

Figure 1:
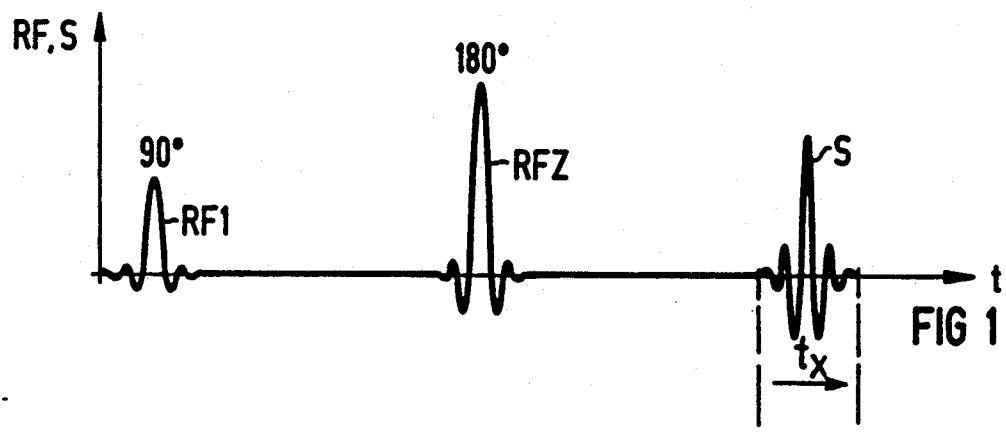
FIG. 1, as described above, shows two radio-frequency pulses and the resulting spin echo signal in a conventional spin echo sequence.
Figure 2:
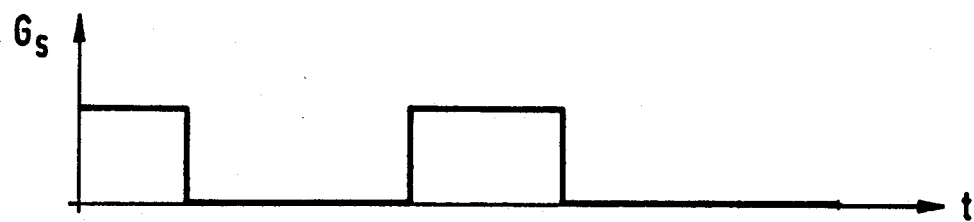
FIG. 2 as described above, shows the slice selection gradient in a conventional spin echo sequence.
Figure 3:
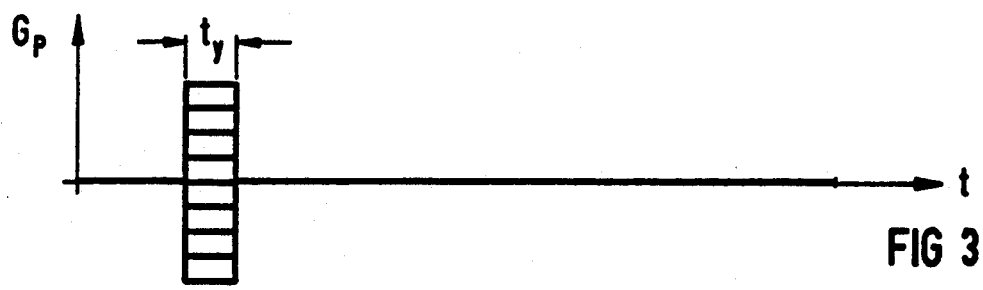
FIG. 3, as described above shows the phase-coding gradient in a conventional spin echo sequence.
Figure 4:
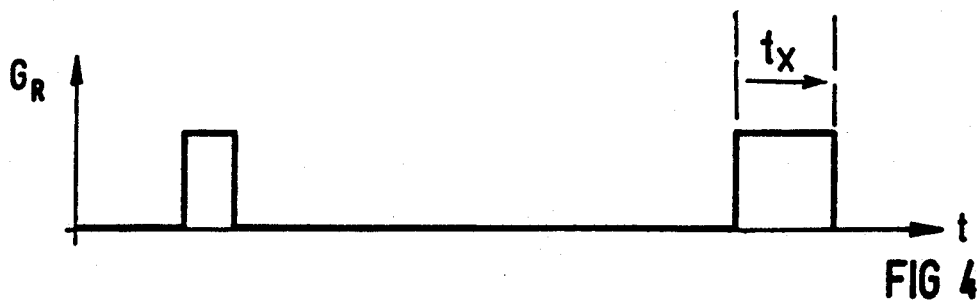
FIG. 4, as described above, shows the read-out gradient in a conventional spin echo sequence.
Figure 5:
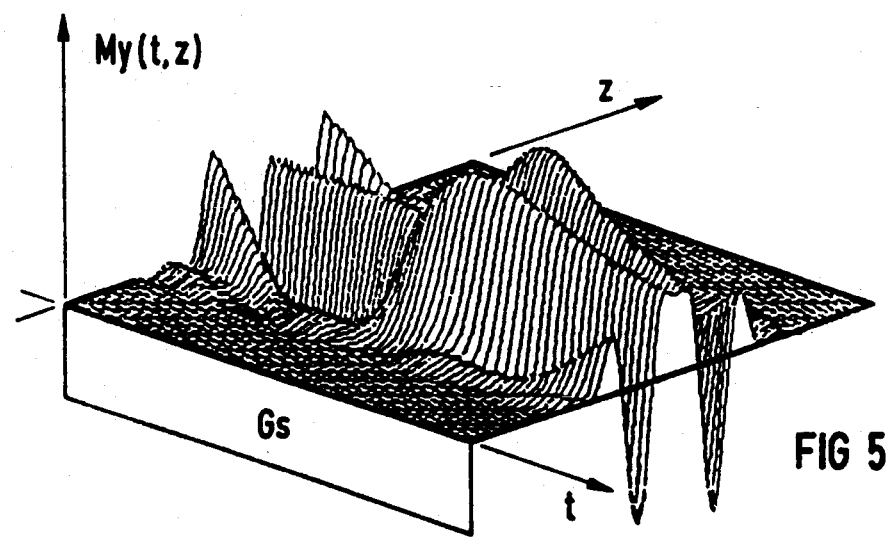
FIG. 5 is a three-dimensional plot showing the distribution of the transverse magnetization $M_y$ dependent on time t and on the locus coordinate z after a selective excitation.

A three-dimensional plot of the curve of the transverse magnetization $M_y$ under the gradient G dependent on time t and on the locus coordinate z is shown in FIG. 5. The measured echo signal A(t) represents an integral of $M_y$ over the locus coordinate z. The signal A(t) is used as the basis for a new, optimized, selective radio-frequency pulse. In order to avoid undesirable sidebands of the new radio-frequency pulse, radio-frequency signals parts of the signal A(t) are cut off, such as the high-frequency parts. This can be undertaken, for example, using a Hamming filter.

Figure 9:
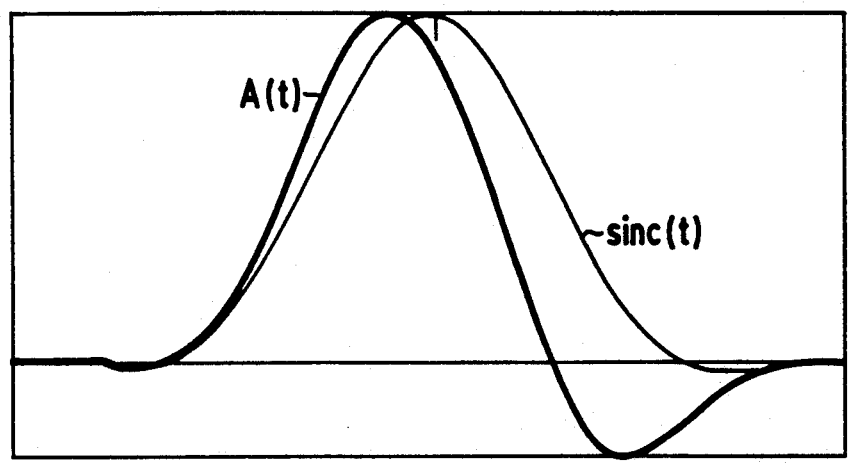
FIG. 9 shows a comparison of the acquired echo signal with the sinc pulse.

A comparison of the acquired echo signal A(t) with the sinc pulse is shown in FIG. 9. As can be seen, the echo signal A(t) which is employed as the optimized radio-frequency shape after filtering is unsymmetrical, in contrast to the sinc pulse.

Figure 10:
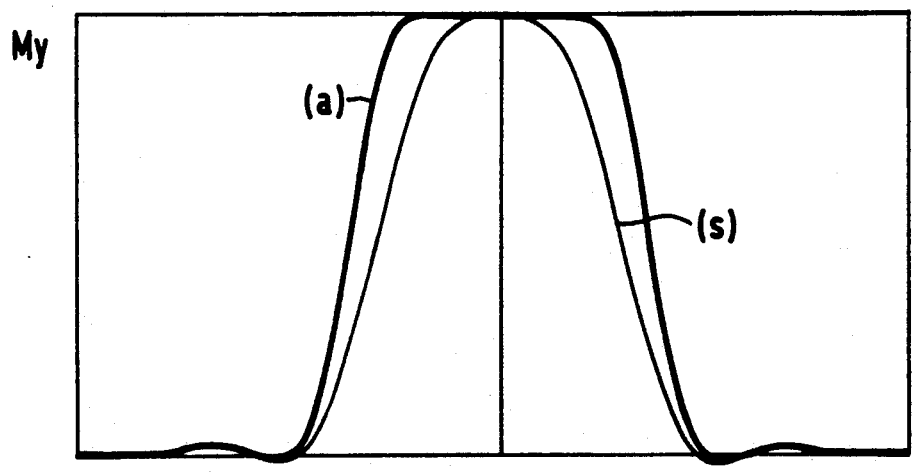
FIG. 10 shows the slice profile which is obtained in accordance with the method of the invention.

The curve of the transverse magnetization $M_y$ is shown over the z coordinate (i.e., the slice profile) in FIG. 10 for excitation with a sinc function (curve s) and for excitation with the optimized radio-frequency pulse shape (curve a). It can clearly be seen that the slice profile is approximated to the ideal rectangular shape significantly better as a consequence of the optimized radio-frequency pulse than in the case of the sinc function.

In order to intensify the non-linearity appearing in the excitation of nuclear magnetic resonance systems in the optimization, one can proceed from a flip angle in the excitation according to FIG. 6 which is significantly greater than the flip angle which is used in a later measurement sequence. In spin echo sequences wherein a flip angle of 90° is typically employed, for example, a flip angle of >90° can be selected in the excitation of FIG. 6. When the optimized radio-frequency pulse shape is used in a pulse sequence, the flip angle achieved therewith is proportional to the integral over the function A(t). The flip angle can be arbitrarily set by an appropriate scaling of the amplitude of the function A(t).

Instead of experimentally calculating the optimized radio frequency pulse shape as shown, the function A(t) may be identified on the basis of a simulation calculation by using a sinc pulse as the input for the simulation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining an optimized radio-frequency pulse shape for selective excitation of a spin system, comprising the steps of:
    (a) producing the effect of exciting a spin system by a frequency-selective radio frequency pulse;
    (b) producing the effect of reading out an echo signal having high-frequency signal parts arising from step (a);
    (c) cutting off said high-frequency signal parts of said echo signal with a filter to obtain a filtered echo signal; and
    (d) employing said filtered echo signal as an optimized radio-frequency pulse shape for further excitation of said spin system.

2. A method as claimed in claim 1 wherein step (a) is further defined by physically exciting said spin system with a real frequency-selective radio-frequency pulse and wherein step (b) is further defined by undertaking an actual read-out of the echo signal resulting from said radio-frequency pulse.

3. A method as claimed in claim 2 wherein step (b) is further defined by reading-out said echo signal under the influence of a gradient in order to obtain a gradient echo.

4. A method as claimed in claim 1 wherein (a) is further defined by calculating the effect of excitation of said spin system by a frequency-selective radio frequency pulse by simulation calculation, and wherein step (b) is further defined by calculating the echo signal arising from the simulated calculation of step (a) by further simulation calculation.

5. A method as claimed in claim 1 wherein steps (a) and (d) are further defined by using a radio-frequency pulse in step (a) for optimization having a larger flip angle than subsequent radio-frequency pulses used after optimization in step (d).

6. A method as claimed in claim 1 wherein step (a) is further defined by using a sinc pulse as said frequency-selective radio-frequency pulse.

7. A method as claimed in claim 1 wherein step (c) is further defined by cutting off said high-frequency signal parts using a Hamming filter.

* * * * *